United States Patent
Fleury et al.

(10) Patent No.: US 7,899,641 B2
(45) Date of Patent: Mar. 1, 2011

(54) TESTABLE ELECTRONIC CIRCUIT

(75) Inventors: Hervé Fleury, Caen (FR); Jean-Marc Yannou, Colomby sur Thaon (FR)

(73) Assignee: NXP B.V., Eindhoven (NL)

( * ) Notice: Subject to any disclaimer, the term of this patent is extended or adjusted under 35 U.S.C. 154(b) by 460 days.

(21) Appl. No.: 11/815,313

(22) PCT Filed: Jan. 31, 2006

(86) PCT No.: PCT/IB2006/050326
§ 371 (c)(1),
(2), (4) Date: Nov. 14, 2007

(87) PCT Pub. No.: WO2006/082555
PCT Pub. Date: Aug. 10, 2006

(65) Prior Publication Data
US 2008/0133167 A1     Jun. 5, 2008

(30) Foreign Application Priority Data
Feb. 1, 2005  (EP) .................................. 05300077

(51) Int. Cl.
*G01R 31/00*  (2006.01)
(52) U.S. Cl. ..................... 702/120; 714/724; 714/726; 714/744
(58) Field of Classification Search ................. 702/100, 702/57, 69, 79, 81, 84, 117, 118, 120, 121, 702/122, 124, 125, 126, 176–178, 182–185, 702/189, 197; 326/16; 714/724, 726–732, 714/744
See application file for complete search history.

(56) References Cited

U.S. PATENT DOCUMENTS 5,337,321 A     8/1994  Ozaki (Continued)

FOREIGN PATENT DOCUMENTS

WO     WO 2004075250 A2 *  9/2004

*Primary Examiner*—Eliseo Ramos Feliciano
*Assistant Examiner*—Ricky Ngon

(57) ABSTRACT

An electronic circuit contains groups of flip-flops (12*a-c*), coupled to data terminals (11*a-c*) of the circuit and to a functional circuit (10). Each group (12*a-c*) has a clock input for clocking the flip-flops of the group. Each group (12*a-c*) can be switched between a shift configuration and a functional configuration, for serially shifting in test data from the data terminals and to function in parallel to supply signals to the functional circuit (10) and/or receive signals from the functional circuit (10) respectively. A test control circuit (16) can be switched between a functional mode, a test shift mode and a test normal mode. The test control circuit (16) is coupled to the groups of flip-flops (12*a-c*) to switch the groups to the functional configuration in the functional mode and to the shift configuration in the test shift mode. A clock multiplexing circuit (15*a-c,* 18) has inputs coupled to the data terminals (11*a-c*) and outputs coupled to clock inputs of the groups (12*a-c*). The test control circuit (16) is coupled to control the clock multiplexing circuit (15*a-c,* 18) dependent on the mode assumed by the test control circuit (16). The clock multiplexing circuit (15*a-c,* 18) is arranged to substitute clock signals from respective ones of the data terminals (11*a-c*) temporarily at the clock inputs of respective ones of the groups (12*a-c*) in the test normal mode.

7 Claims, 2 Drawing Sheets

U.S. PATENT DOCUMENTS

Figure 1:
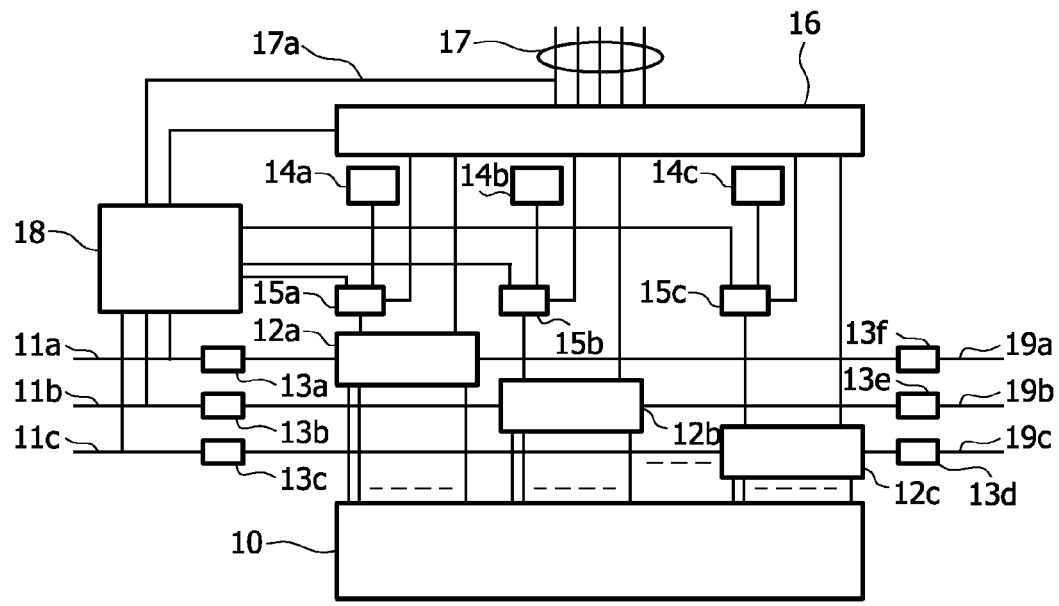

| | | |
|---|---|---|
| 5,606,565 A | 2/1997 | Edler et al. |
| 6,115,827 A | 9/2000 | Nadeau-Dostie et al. |
| 6,131,173 A | 10/2000 | Meirlevede et al. |
| 6,393,592 B1 | 5/2002 | Peeters et al. |
| 6,442,721 B2 * | 8/2002 | Whetsel ...................... 714/726 |
| 6,484,280 B1 * | 11/2002 | Moberly ..................... 714/726 |
| 6,763,489 B2 * | 7/2004 | Nadeau-Dostie et al. .... 714/731 |
| 2003/0084390 A1 | 5/2003 | Tamarapalli et al. |
| 2003/0145264 A1 * | 7/2003 | Siegel et al. ................ 714/726 |
| 2003/0169070 A1 * | 9/2003 | West et al. .................... 326/38 |
| 2005/0022083 A1 | 1/2005 | Wu |

* cited by examiner

TESTABLE ELECTRONIC CIRCUIT

The invention relates to an electronic circuit, in particular to a testable integrated circuit that contains a plurality of clock domains. The invention also relates to a method of testing such an electronic circuit and to a tester apparatus for testing such an electronic circuit.

U.S. Pat. No. 6,131,173 discloses a testable integrated circuit that comprises a plurality of clock domains. With the increasing size of current day integrated circuits it has become necessary to divide the functional circuits of an integrated circuit into different clock domains. During normal operation such an integrated circuit uses a plurality of partly or wholly independent clock signals to control the operation of circuitry in the different clock domains. Typically the integrated circuit contains a plurality of internal clock circuits to generate the majority of the different clock signals internally. A typical clock circuit may comprise an oscillator circuit or a PLL circuit to generate a clock signal that is locked to a reference signal for example.

The use of different clock domains makes testing of the integrated circuit more difficult. Simultaneous operation of different clock signals (especially internally generated clock signals) can lead to unpredictable relative timing, which in turn can lead to unpredictable test results.

Various solutions have been devised for this problem. U.S. Pat. No. 6,131,173, for example, discloses how a clock domain isolation circuit can be used to isolate functional circuits from different clock domains from one another to avoid unpredictable test results. Other solutions include the use of a special test clock signal in the test mode throughout the entire circuit, or a special interface between different clock domains to realize predictable timing etc.

This kind of solution realize predictable test results, but often at the expense of considerable circuit overhead in the circuit under test. These solutions make it difficult to perform a differentiated "at speed" test, for determining whether the different circuit parts are able to make data available within respective different delay intervals.

Among others, it is an object of the invention to reduce the amount of circuit overhead that is needed for testing electronic circuits that contain a plurality of clock domains.

Among others, it is an object of the invention to increase the degree of control over the clock signals in an electronic circuit under test.

An integrated circuit according to the invention is claimed in claim 1. According to the invention external terminals of the integrated circuit that are used to shift in test data are temporarily reemployed to supply clock signals to time capture of test results when the integrated circuit captures test results during testing. Typically, during the test respective external terminal are used to supply clock signals to parts of the circuit that are normally clocked with respective internal clock circuits. When the test data is shifted in a single test clock is preferably used to supply clock signals to all of these circuits to shift in test data. In this way, full external control over the different clock signals is available during the timing critical part of testing, without requiring a large number of additional external terminals for the supply of clock signals.

These and other objects and advantageous aspects of the invention will be described using non-limitative examples, by reference to the following figures.

Figure 2:
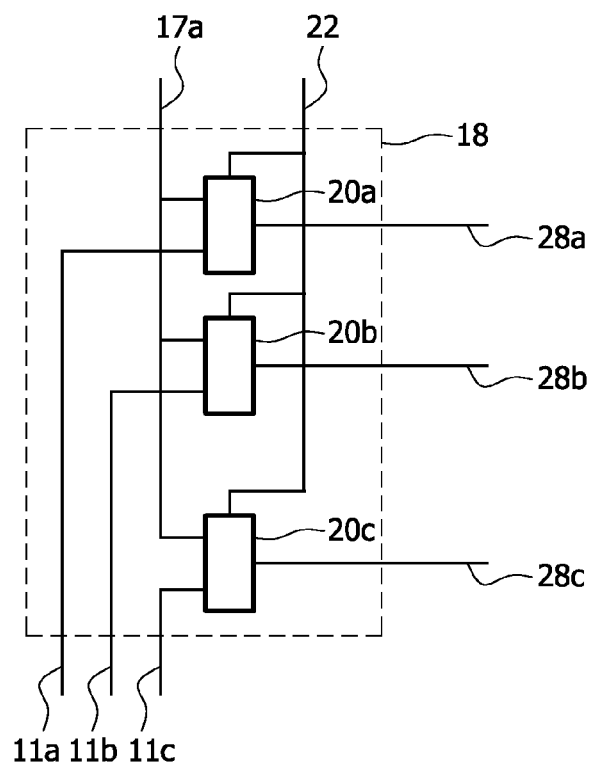
Figure 3:
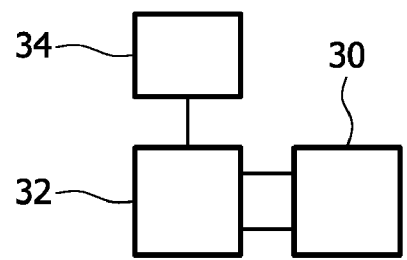
Figure 4:
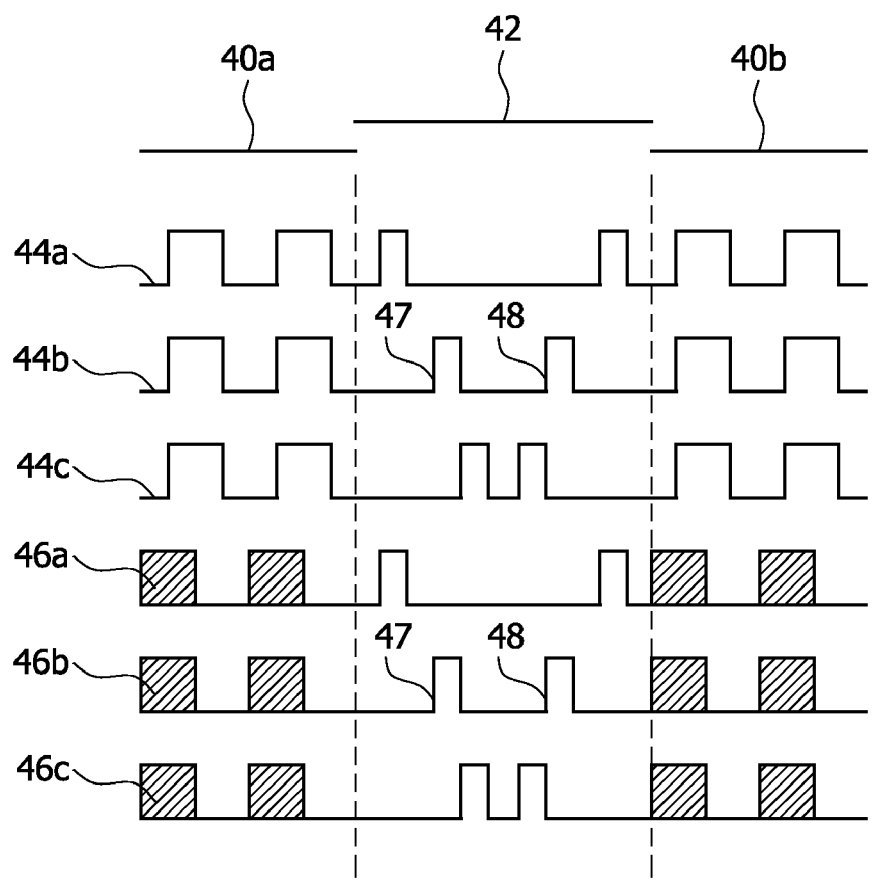

FIG. 1 shows a testable circuit
FIG. 2 shows a clock switching circuit
FIG. 3 shows a test system
FIG. 4 shows test signals FIG. 1 shows a testable circuit comprising functional circuits 10, groups of flip-flops 12a-c, boundary scan cells 13a-f, clock circuits 14a-c, first clock switching circuits 15a-c, a test control circuit 16 and a second clock switching circuit 18. The components of the testable circuit are preferably integrated into an integrated circuit. In a typical embodiment, flip-flops 12a-c operate in combination with functional circuits 10 during normal (non-test) operation, functional circuits 10 containing only combinatorial logic circuits (no flip-flops).

The testable circuit can be considered to comprise a data flow part, a clock flow part and a test control part. The data flow part has inputs 11a-c and outputs 19a-c (both typically external input connections of the integrated circuit). Each input 11a-c is coupled to a respective boundary scan input cell 13a-c, which in turn is coupled to an input of a respective groups of flip-flops 12a-c. Each groups of flip-flops 12a-c has an output coupled to a respective output boundary scan cell 13d-f, which in turn is coupled to a respective output 19a-c.

In the clock flow part, the groups of flip-flops 12a-c receive respective clock signals from respective first clock switching circuits 15a-c. First clock switching circuits 15a-c each have a first input coupled to a respective clock circuit 14a-c and a second input coupled to second clock switching circuit 18. Second clock switching circuit 18 has a first clock input coupled to a test clock input 17a from a test interface 17 and second clock inputs coupled to the respective inputs 11a-c.

The test control part has a test interface 17 (typically external input connections of the integrated circuit) coupled to test control circuit 16. The test interface may be a conventional scan control interface for example, comprising connections TCK for a test clock, TDI for test input data, TDO for test output data, TDS for test control and RST for reset. Test control circuit 16 has outputs coupled to control inputs of first clock switching circuits 15a-c, to control inputs of the groups of flip-flops 12a-c, to second clock switching circuit 18 and to boundary scan cells 13a-f.

In normal functional operation test control circuit 16 is switched to a functional state, in which test control circuit 16 makes the individual flip-flops (not shown) of the groups of flip-flops 12a-c function to supply and capture digital data to and from functional circuits 10 in parallel. This type of normal functional operation of a testable circuit is known per se and therefore not described in detail.

During this normal functional operation timing of capture and/or supply the flip-flops of respective ones of the groups of flip-flops 12a-c are controlled by respective ones of the clock circuits 14a-c. Each first clock switching circuits 15a-c is arranged to pass alternatively a clock signal from a respective one of the clock circuits 14a-c or a clock signal from second clock switching circuit 18.

During normal functional operation, test control circuit 16 supplies control signals to the first clock switching circuits 15a-c to pass the clock signals from clock circuits 14a-c to the flip flops of the groups of flip-flops 12a-c. For this purpose each first clock switching circuit 15a-c contains for example a multiplexer circuit with multiplexed inputs coupled to clock circuits 15a-c and second clock switching circuit 18 and control inputs coupled to test control circuit 16.

By way of example the external inputs 11a-c and outputs 19a-c have been shown to be coupled only to the groups of flip-flops 12a-c so that during normal functional operation certain individual flip-flops (not shown) will supply and/or capture digital data to and/or from external inputs 11a-c and/or outputs 19a-c. However, functional circuits 10 may also be connected directly to external inputs 11a-c and/or outputs 19a-c to receive and/or supply digital data during normal functional operation. This type of connection has been omitted from the figure for the sake of clarity, but it should be understood that connections of this type may be present.

Under control of test interface, the testable circuit can be switched to a test mode. In the test mode test control circuit 16 supports a test shift state and a test normal state. These types of states, and the control of switching between such states is known per se and will therefore not be described in detail. In one embodiment for example, the test control circuit 16 comprises a state machine that is able to assume different states and supply appropriate control signals in each state, a control signal from the interface control 17 whether and when the state machine switches from one state to another.

In the test shift state test control circuit 16 (see FIG. 2) controls the flip-flops of the groups of flip-flops 12a-c so that each group of flip-flops 12a-c functions as a respective serial shift register. The circuit arrangements of the group of flip-flops 12a-c to support this operation are known per se and therefore not described in detail. In the shift state, test control circuit 16 controls second clock switching circuit 18 to supply the same test clock signal to all first clock switching circuits 15a-c, and test control circuit 16 controls first clock switching circuits 15a-c to supply this test clock signal to the flip-flops of the groups 12a-c to control the timing of serial shifting.

The test shift state is used to shift in test data from inputs 11a-c through the groups of flip-flops 12a-c before the test data can be applied to functional circuits 10 and to shift out test results to outputs 19a-c through the groups of flip-flops 12a-c. In an embodiment signature computation circuits (not shown) may be added between the groups of flip-flops 12a-c and the outputs 19a-c so that only signature data needs to be output.

In the test normal state test control circuit 16 controls the flip-flops of the groups of flip-flops 12a-c so that the flip-flops capture data signals from the functional circuit 10 in parallel. The time of capture is controlled by the clock signals. In the test normal state test control circuit 16 controls second clock switching circuit 18 to supply signals from inputs 11a-c to first clock switching circuits 15a-c and test control circuit 16 controls first clock switching circuits 15a-c to supply respective ones of these signals to the flip-flops of respective ones of groups 12a-c to control the time of capture.

FIG. 2 shows an embodiment of second clock switching circuit 18. In this embodiment second clock switching circuit 18 contains a plurality of multiplexer circuits 20a-c, with first multiplex inputs coupled to a connection 17a for receiving a test clock signal and second multiplex inputs coupled to inputs 11a-c. Outputs 28a-d of the multiplexer circuits 20a-c are coupled to inputs of respective ones of the first clock switching circuits 15a-c (shown in FIG. 1). A common control input 22 of the multiplexer circuits 20a-c is coupled to the test control circuit 16 (shown in FIG. 1). In the test shift state the test control circuit 16 controls the multiplexing circuits 20a-c to pass the test clock signal from the clock input 17a to the first clock switching circuits 15a-c. In the test normal state the test control circuit 16 controls the multiplexing circuits 20a-c to pass signals from inputs 11a-c to the first clock switching circuits 15a-c.

FIG. 3 shows a typical test system. The system contains a circuit under test 30, a test signal supply apparatus 32 and a test signal selector apparatus 34. The circuit under test 30 is a testable circuit such as the one shown in FIG. 1. In operation, the inputs, the outputs and the test interface of circuit under test 30 are coupled to test signal supply apparatus 32. Test signal supply apparatus 32 supplies test data and control signals to circuit under test 30 and receives back test results (e.g. data captured from functional circuits 10 or signatures computed from such data), which are evaluated to determine whether the circuit contains faults. Prior to testing test signal selector apparatus 34 receives a description of the circuit under test and generates a collection of test data patterns so that certain classes of relevant errors will show up in the test results. Test signal selector apparatus 34 supplies information about the selected patterns and the expected test results in the case of an error free circuit to test signal supply apparatus.

Test signal supply apparatus 32 supplies the test patterns to inputs 11a-c and supplies control signals to test interface 17 to make groups of flip-flops 12a-c shift the test patterns through the flip-flops. Next test signal supply apparatus 32 supplies control signals to switch test control circuit 16 to the test normal state. At this time second clock switching circuit 18 is made to pass signals from the inputs 11a-c to the groups of flip-flops 12a-c to control clocking. In this way, test signal supply apparatus 32 is given full control of timing during capture. Test signal supply apparatus 32 supplies clock pulses at the inputs 11a-c with a timing selected according to a desired test, for example to determine whether certain parts of the functional circuit respond with a required speed.

FIG. 4 shows signals used during testing. Three time intervals 40a, 42, 40b are indicated. During the first and third time interval 40a,b the test control circuit is in the test shift state and during a capture interval 42 in the middle the test control circuit is in the test normal state. Respective clock signals 44a-c of the groups are shown. These clock signals are generated inside the integrated circuit, partly from internal signals and partly from external signals. During the first and third time interval 40a,b, when the test control circuit is in the shift state, clock signals 44a-c are clock pulses defined by one test clock signal so that clock signals 44a-c are substantially identical. During normal functional operation outside testing, of course these clock signals may be different, since they are supplied by different clock circuits 15a-c during normal functional operation.

During the capture interval 42 of testing, when the test control circuit is in the test normal state, clock signals 44a-c derive from signals at inputs 11a-c, so that each clock signal 44a-c may be defined individually by test signal supply apparatus. Input signals 46a-c show examples of signals at inputs 11a-c. During the first and third time interval 40a,b, input signals 46a-c contain test data (indicated by hatching), which is not passed to clock signals 44a-c.

In the capture interval 42, input signals 46a-c contain clock pulses 47, 48, which are passed to clock signals 44a,c. Different ones of the input signals 46a-c may be mutually different, or differently timed, clock pulses under control of test signal supply apparatus 32, with the result that different clock signals 44a-c may also be mutually different in the capture interval 42.

In the example of FIG. 4, two clock pulses 47, 48 are applied to each group of flip-flops 12a-c. Pulse 48 causes flip-flops in the corresponding group to capture data. The first pulse 47 may be used to create a signal transition at an input of functional circuits 10. In a typical circuit a pair of the flip-flops may be used for this purpose, wherein an input of a first flip-flop of the pair has a functional connection to the output of a second flip-flop of the pair. During test shifting mutually opposite test data values are loaded into the flip-flops of the pair. Initially (before the first pulse 47) the first flip-flop supplies a first test data value to the functional circuits 10. In response to the first clock pulse 47 the flip-flops, including the first flip-flop of the pair, load data. As a result the first flip-flop of the pair loads data from the second flip-flop, which has the effect that the output signal from the first flip-flop to the functional circuit changes value. After a time delay the second pulse 48 causes the flip-flops to capture data once more, with the result that another flip-flop will capture a result signal from the functional circuit 10 that can be affected by the signal from the first flip-flop of the pair. Typically the captured result signal will be shifted out through the outputs 19a-c for examination. The captured result signal is examined to determine whether the functional circuit has responded correctly in the time interval defined by the clock pulses.

It will be appreciated that this is only one example of how the external clock pulses may be used. In other examples a more complex test, which involves more timed capture operations, may be performed. In this case more than two clock pulses 47, 48 may be applied from the external terminals during the test normal state. Instead of creation of a transition by means of loading of mutually opposite test data other techniques may be used, such as the use of flip-flops that are put in a toggle configuration in the test normal mode, or the use of inversion circuits that are activated by the first clock pulse 47 at the output of flip-flops.

In this way data can be captured in each group of flip-flops with any desired timing relation. In the example of FIG. 4 for example, different groups of flip-flops 12a-c may be arranged to operate at mutually different clock frequencies of say, 10 MHz, 16.6 MHz and 50 MHz, and test signal supply apparatus may be arranged to supply clock pulses to in inputs 11a-c at time distances corresponding to these frequencies, or with maximum or minimum acceptable time distances.

Although the invention has been described by means of a specific embodiment, it should be understood that the invention is not limited to this embodiment. For example, although the invention has been described in conjunction with a boundary scan test circuit, it should be understood that the invention can be applied separate from boundary scan. As another example, although the use of inputs 11a-c has been described for the temporary supply of clock signals, it should be understood that one or more terminals that may be used both as inputs and outputs during normal functional operation may be used for temporary supply of clock signals during testing. With some additional tri-state circuits even terminals 29a-c that are used only as output during functional operation may be used to supply clock signals. The point is that the terminals that are used for this purpose, whatever their normal function, do not need to receive or supply other signals when the circuit is temporarily not in the scan shift state during capture. Furthermore, although three groups of flip-flops 12a-c, three inputs 11a-c and three outputs 19a-c have been shown, it should be understood that any number of flip-flops 12a-c, inputs 11a-c and outputs 19a-c may be used. The clock signals from any input or other terminals may be supplied instead of a clock signal from any clock circuit 14a-c, it is not necessary that the input 11a-c that serves to supply data to a specific group of flip-flops 12a-c supplies the clock signals for that same group.

Although clock circuits 14a-c are shown as separate units, it should be understood that there may be connections between the clock circuits, for example because some or all of them are arranged to lock to a common clock source. Furthermore, although all clock circuits are preferably integrated in the same integrated circuit, it should be understood that alternatively one or more of the clock circuits may be coupled to the integrated circuit via external terminals. Furthermore, although an embodiment was shown wherein each input 11a-c was coupled to the clock input of a respective predetermined group of flip-flops 12a-c, it should be understood that alternatively switching circuits may be provided so that the inputs 11a-c are coupled to selectable groups of flip-flops 12a-c, which are selected by test control circuit 16, for example dependent on control commands received by the test control circuit 16.

Furthermore, although the clock signals from second clock switching circuit 18 are shown as replacements for clock signals from respective clock circuits 14a-c, it should be understood that there need not be such a one to one relation. In one embodiment a clock signals from a specific clock circuit 15a-c may be replaced by two or more different clock signals from inputs 11a-c, which are applied to different sub-groups of flip-flops. In another embodiment, clock signals from a plurality of the clock circuits 14a-c, e.g. from two of such clock circuits 14a-c, may all be replaced by the same clock signal from one of the inputs 11a-c. The use of different inputs 11a-c to supply different clock signals in the test normal state to different parts of the circuit has the advantage that many circuit parts can be tested in parallel, each with its own timing, but parts that require the same timing may be tested with a common clock signal. Even if different groups of flip-flops 12a-c receive the same clock signal during normal functional operation it may be advantageous to test these groups using clock signals from different inputs 11a-c, since this can be used to show up additional errors.

Furthermore, although a circuit has been shown wherein one test clock signal is used to control shifting in all groups of flip-flops 12a-c, it should be understood that alternatively a plurality of different test clock signals may be used to control different subsets of the groups 12a-c. During capture these are replaced by signals from the inputs 11a-c so that more different clock signals or clock signals with more freely selectable timing properties are available.

In the prior art powerful methods have been developed to select test patterns that show up circuit faults efficiently, given a specification of the circuit structure of the circuit under test. Test signal selector apparatus 34 may be arranged to supply such prior art methods. However, in this case a problem may arise because such methods do not account for the fact that a terminal may temporarily change to a clock terminal during the test. One way of handling this is to provide test signal selector apparatus 34 with a specification of a virtual circuit structure, which has separate inputs for the clock signals and for data. The test patterns for this virtual circuit are subsequently compiled to test patterns for the real circuit by "merging" data and clock terminals, i.e. by selecting test patterns that contain only signals for the data terminals, and copying the signals for the data terminal from the test patterns for the virtual circuit for all but the time interval wherein the circuit is in the test normal mode. The clock signals from the test patterns during the test normal mode for the virtual circuit are copied to the test pattern for the data terminal of the real circuit.

In an embodiment hold circuits are provided between the external data terminals 11a-c that are used to supply clock signals and the internal circuits that receive signals from these data terminals. The hold circuits are coupled to the test control circuit to receive control signals. When the circuit enters the test normal state, the test control circuit controls these hold circuits to supply to the internal circuits a last input signal that was received prior to entering the test normal state. When the circuit leaves the test normal state the test control circuit controls the hold circuits to resume passing of their input signals. In this way the clock signals that are applied to the terminals in the test normal state do not reach the internal circuits via the normal circuit path.

A disadvantage of the use of data terminals for test clock pulses is that test coverage may be reduced when the data terminals are not available for the application of test signals in the test normal mode. Preferably, circuitry is provided that supports a clock test mode and a data test mode. In an embodiment the test control circuit is arranged to respond to a test command to switch to the clock test mode or the data test mode. In the clock test mode the test control circuit causes the clock switching signals to supply the clock signals from the terminals 11a-c to the clock inputs when in the test normal mode, as described in the preceding. Preferably the control circuit controls the hold circuits to hold data in this mode, as described in the preceding. In the data test mode the test control circuit causes the clock switching signals to supply the test clock signal to the clock inputs when in the test normal mode. If hold circuits are used the control circuit, when in the data test mode, controls these hold circuits to pass data in the test normal state. In this way both normal tests and test that use external clock signals may be performed under control of the test control circuit.

The invention claimed is:

1. A testable electronic circuit, comprising
   a plurality of data terminals;
   a functional circuit;
   a plurality of groups of flip-flops, coupled to the data terminals and to the functional circuit, and each having a clock input for clocking the flip-flops of the group, each group being switchable between a shift configuration and a functional configuration, for serially shifting in test data from the data terminals and to function in parallel to supply signals to the functional circuit and/or receive signals from the functional circuit respectively;
   a test control circuit that is switchable between a functional mode, a test shift mode and a test normal mode, the test control circuit being coupled to the groups of flip-flops to switch the groups to the functional configuration in the functional mode and to the shift configuration in the test shift mode; and
   a clock multiplexing circuit comprising:
      a first clock input to receive an external test clock signal for use in the test shift mode;
      second clock inputs coupled to the data terminals to receive clock signals for use in the test normal mode;
      third clock inputs to receive internal clock signals for use in the functional mode; and
      outputs coupled to the clock inputs of the groups of flip-flops;
   wherein the test control circuit is coupled to control the clock multiplexing circuit dependent on the mode assumed by the test control circuit for selection of the test clock signal from the first clock input in the test shift mode, selection of the clock signals from the second clock inputs in the test normal mode, and selection of the internal clock signals from the third clock inputs in the functional mode; and
   wherein the clock multiplexing circuit is arranged to substitute the second clock signals from respective ones of the data terminals temporarily at the clock inputs of respective ones of the groups in the test normal mode.

2. A testable electronic circuit according to claim 1, comprising a test clock terminal coupled to the clock multiplexing circuit, the clock multiplexing circuit being arranged to supply the test clock signal from the test clock terminal to the clock inputs of the groups in the test shift mode.

3. A testable electronic circuit according to claim 2, comprising a plurality of clock circuits coupled to the clock multiplexing circuit, the clock multiplexing circuit being arranged to supply the internal clock signals from respective ones of the clock circuits to the clock inputs of respective ones of the groups in the functional mode.

4. A test system comprising an electronic circuit as claimed in claim 1 and a test pattern supply apparatus coupled to the data terminals of the electronic circuit, wherein the test supply apparatus is programmed to supply pulses with a programmed timing pattern to the data terminals when the test control circuit has been brought into the capture mode.

5. A testable electronic circuit according to claim 1, wherein the clock signals from at least two of the data terminals have mutually different timing patterns.

6. A testable electronic circuit according to claim 1, wherein the test control circuit is further configured to control the clock multiplexing circuit to change a clock route to feed a test clock signal to the groups of flip-flops prior to entering the test shift mode.

7. A testable electronic circuit according to claim 6, wherein the test control circuit is further configured to control the clock multiplexing circuit to provide an identical test clock signal to the all of the groups of flip-flops in the test shift mode.

* * * * *